(12) United States Patent
Masuda (10) Patent No.: US 9,634,633 B2
(45) Date of Patent: Apr. 25, 2017

(54) ELECTRONIC COMPONENT

(71) Applicant: Murata Manufacturing Co., Ltd., Nagaokakyo-shi, Kyoto-fu (JP)

(72) Inventor: Hiroshi Masuda, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 15/131,123

(22) Filed: Apr. 18, 2016

(65) Prior Publication Data

US 2016/0233844 A1 Aug. 11, 2016

Related U.S. Application Data

(63) Continuation of application No. PCT/JP2014/063452, filed on May 21, 2014.

(30) Foreign Application Priority Data

Oct. 30, 2013 (JP) .................................. 2013-225462

(51) Int. Cl.
*H03H 7/01* (2006.01)
*H01F 17/00* (2006.01)
*H01F 27/00* (2006.01)
*H03H 7/12* (2006.01)
*H03H 7/09* (2006.01)
*H03H 1/00* (2006.01)
*H01F 27/28* (2006.01)
*H01G 4/40* (2006.01)

(52) U.S. Cl.
CPC ........... *H03H 7/0115* (2013.01); *H01F 17/00* (2013.01); *H01F 27/00* (2013.01); *H03H 7/12* (2013.01);
(Continued)

(58) Field of Classification Search
CPC ......... H03H 2001/0085; H03H 7/0115; H03H 7/09; H03H 7/1766
(Continued)

(56) References Cited

U.S. PATENT DOCUMENTS 6,124,779 A * 9/2000 Yamamoto .......... H01F 17/0013
29/604
2006/0145805 A1 7/2006 Kim et al.
(Continued)

FOREIGN PATENT DOCUMENTS

JP 6-97701 A 4/1994
JP 2006-54207 A 2/2006
(Continued)

OTHER PUBLICATIONS

Official Communication issued in International Application PCT/JP2014/063452, mailed on Jul. 29, 2014.

*Primary Examiner* — Stephen E Jones
*Assistant Examiner* — Rakesh Patel
(74) *Attorney, Agent, or Firm* — Keating & Bennett, LLP (57) ABSTRACT

An electronic component includes a device body and first through n-th LC parallel resonators connected in series with each other. The first through n-th LC parallel resonators respectively include first through n-th inductors and first through n-th capacitors. The first through n-th inductors are disposed in the device body such that they are arranged in a first direction in this order. The first and n-th inductors are provided with a spiral shape such that they turn around respective winding axes extending along the first direction. At least one of the second through (n−1)-th inductors is provided with a helical shape such that it turns around a winding axis extending along the first direction.

18 Claims, 6 Drawing Sheets

(52) U.S. Cl.
CPC ........ *H03H 7/1716* (2013.01); *H03H 7/1766* (2013.01); *H01F 27/2804* (2013.01); *H01G 4/40* (2013.01); *H03H 7/09* (2013.01); *H03H 2001/0085* (2013.01)

(58) Field of Classification Search
USPC .................................. 333/175, 185; 336/200
See application file for complete search history.

(56) References Cited

U.S. PATENT DOCUMENTS

| | | | |
|---|---|---|---|
| 2007/0188265 A1* | 8/2007 | Perreault | H03H 7/427 333/181 |
| 2007/0241839 A1* | 10/2007 | Taniguchi | H03H 7/09 333/185 |
| 2009/0189714 A1* | 7/2009 | Sakisaka | H03H 7/0115 333/185 |
| 2010/0026420 A1* | 2/2010 | Chin | H03H 7/0115 333/185 |
| 2010/0033267 A1 | 2/2010 | Mizutani et al. | |
| 2013/0009726 A1 | 1/2013 | Sasaki | |
| 2015/0061791 A1* | 3/2015 | Imamura | H03H 7/09 333/185 |

FOREIGN PATENT DOCUMENTS

| | | |
|---|---|---|
| JP | 2006-190934 A | 7/2006 |
| JP | 2013-21449 A | 1/2013 |
| WO | 2008/114681 A1 | 9/2008 |

\* cited by examiner

ELECTRONIC COMPONENT

BACKGROUND OF THE INVENTION

1. Field of the Invention

The present invention relates to an electronic component, and more particularly, to an electronic component including three or more LC parallel resonators.

2. Description of the Related Art

As an invention concerning an electronic component of the related art, a three-dimensional spiral inductor disclosed in Japanese Unexamined Patent Application Publication No. 2006-190934 (FIG. 16a), for example, is known. This three-dimensional spiral inductor is a helical coil which is disposed within a multilayer body and which turns around a winding axis extending in a direction perpendicular to a stacking direction of the multilayer body. Such a three-dimensional spiral inductor is used in, for example, a low pass filter.

A low pass filter including three-dimensional spiral inductors is defined by a plurality of LC parallel resonators connected in series with each other, each being constituted by a three-dimensional spiral inductor and a capacitor. Since a three-dimensional spiral inductor is provided with a helical shape, the air-core diameter thereof is greater than that of a spiral inductor. Accordingly, with the use of a three-dimensional spiral inductor, a higher Q factor can be obtained than with the use of a spiral inductor, thus making it possible to reduce the insertion loss of a low pass filter.

In a low pass filter, three-dimensional spiral inductors are arranged linearly such that the winding axes thereof substantially coincide with each other. Because of this arrangement, the three-dimensional spiral inductors are positioned too close to each other, which intensifies electromagnetic coupling between the three-dimensional spiral inductors. This makes it easier for a high frequency signal to be transmitted between the three-dimensional spiral inductors in the low pass filter, thus failing to obtain a sufficient attenuation in a band other than a pass band of the low pass filter.

SUMMARY OF THE INVENTION

Accordingly, preferred embodiments of the present invention provide an electronic component in which a sufficient attenuation is obtained in a band other than a pass band while insertion loss is being reduced.

An electronic component according to a preferred embodiment of the present invention includes a device body and first through n-th LC parallel resonators (n is an integer of three or more) connected in series with each other. The first through n-th LC parallel resonators respectively include first through n-th inductors and first through n-th capacitors. The first through n-th inductors are disposed in the device body such that the first through n-th inductors are arranged in a first direction in order from the first inductor to the n-th inductor. The first and n-th inductors are provided with a spiral shape such that the first and n-th inductors turn around respective winding axes extending along the first direction. At least one of the second through (n−1)-th inductors is provided with a helical shape such that the at least one of the second through (n−1)-th inductors turns around a winding axis extending along the first direction.

According to various preferred embodiments of the present invention, it is possible to obtain a sufficient attenuation in a band other than a pass band while insertion loss is being reduced.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Electronic components according to preferred embodiments of the present invention will now be described below.

Figure 1A:
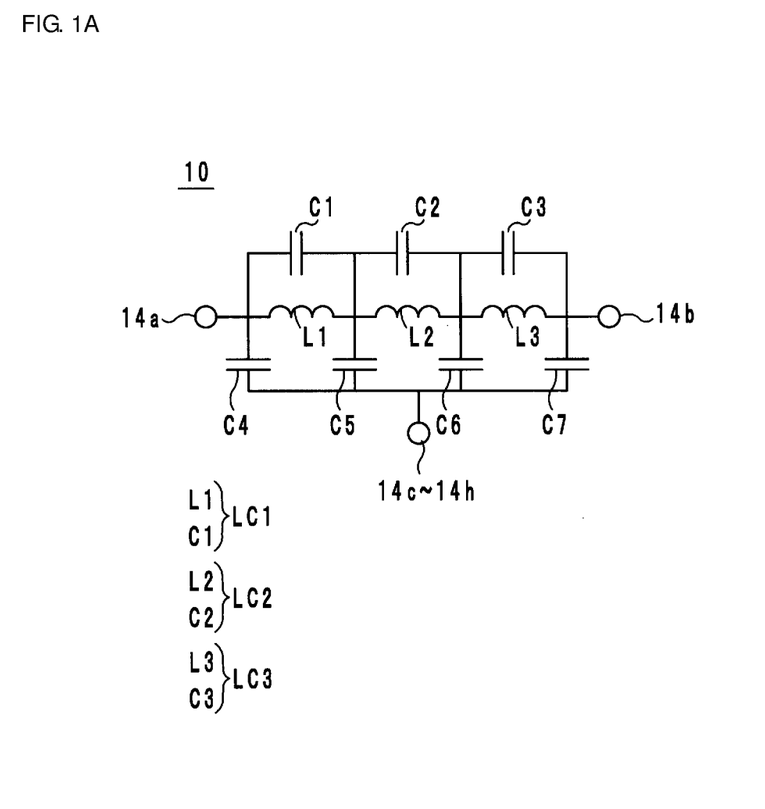
FIG. 1A is an equivalent circuit diagram of an electronic component 10 according to a preferred embodiment of the present invention.
Figure 1B:
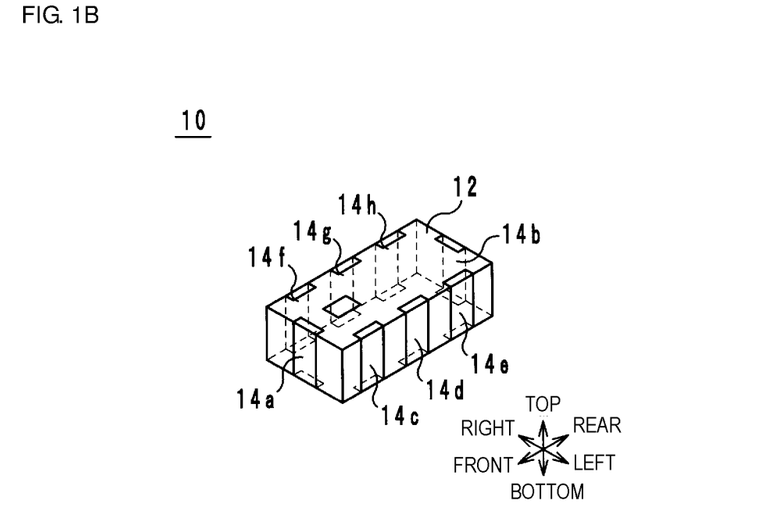
FIG. 1B is an external perspective view of the electronic component 10 shown in FIG. 1A.
Figure 2A:
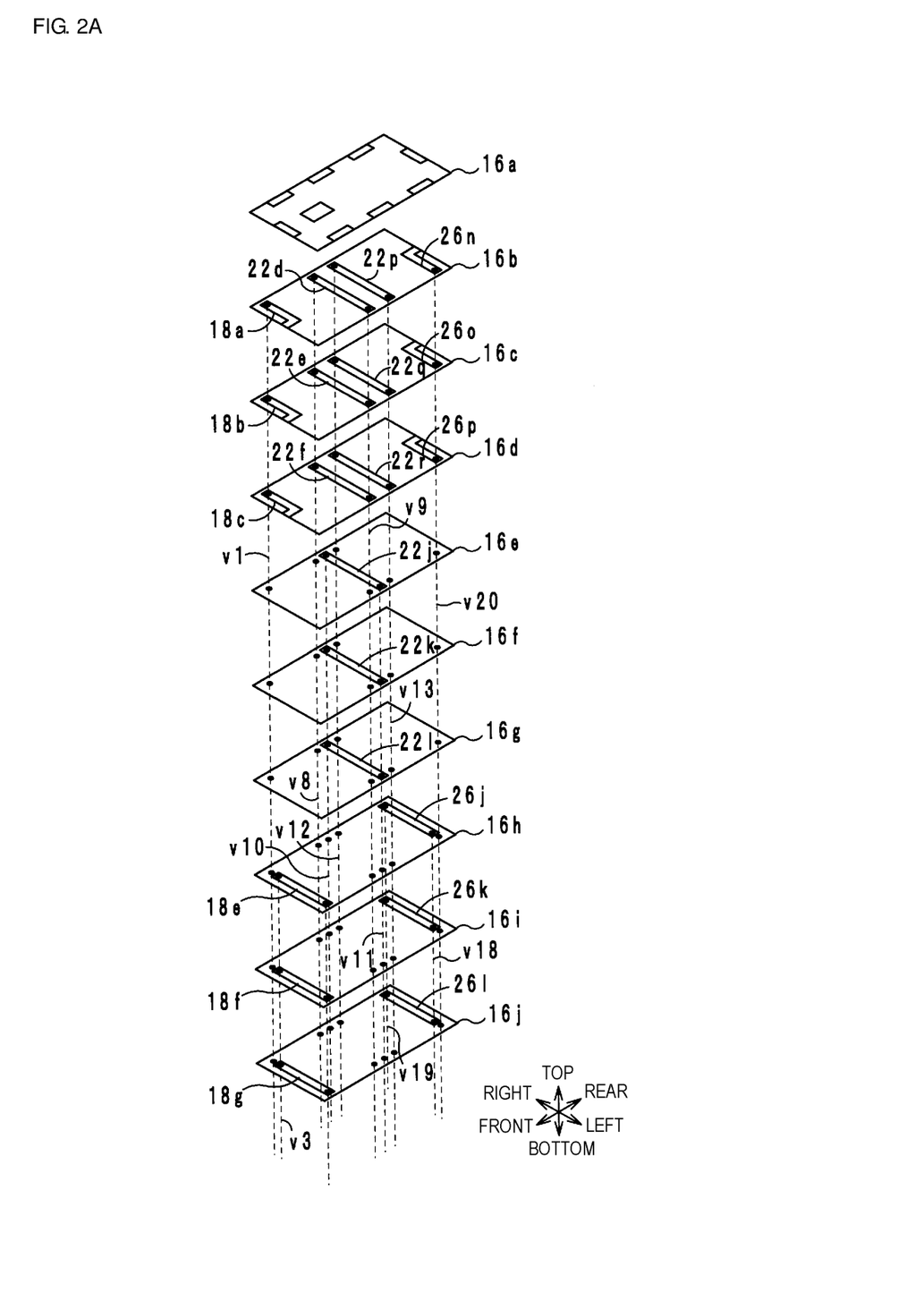
FIG. 2A is an exploded perspective view of a multilayer body 12 of the electronic component 10.
Figure 2B:
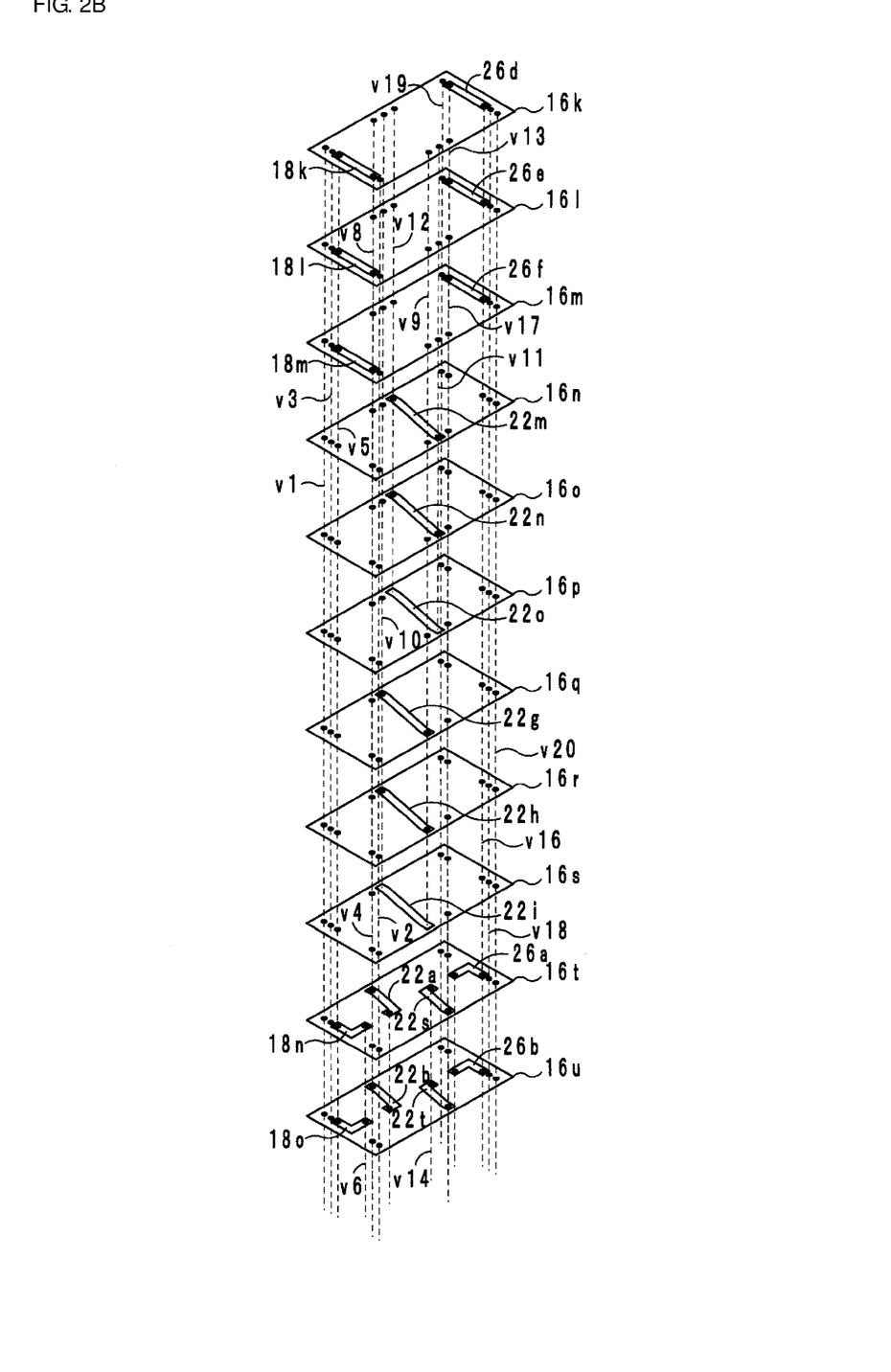
FIG. 2B is an exploded perspective view of the multilayer body 12 of the electronic component 10.
Figure 2C:
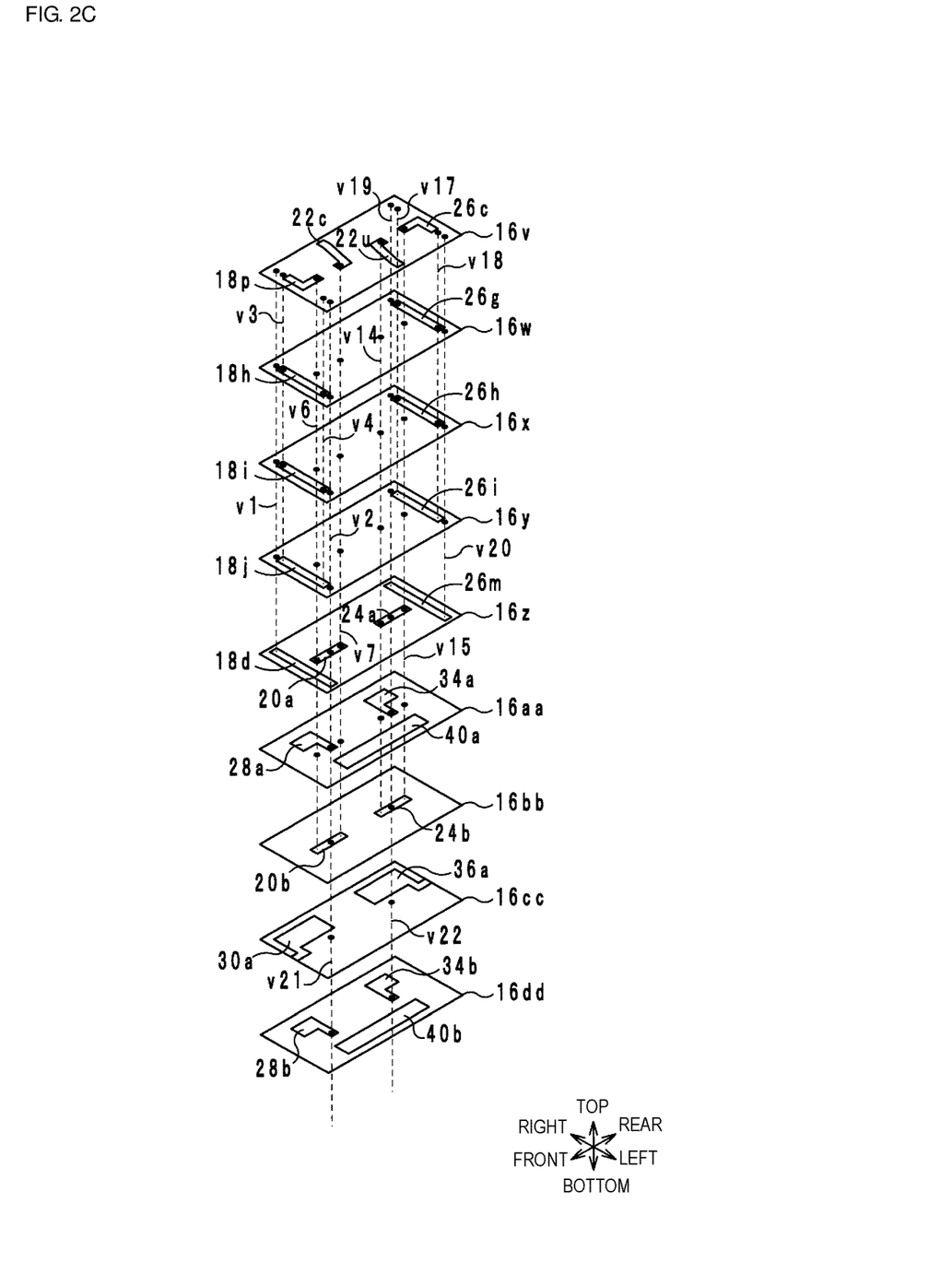
FIG. 2C is an exploded perspective view of the multilayer body 12 of the electronic component 10.
Figure 2D:
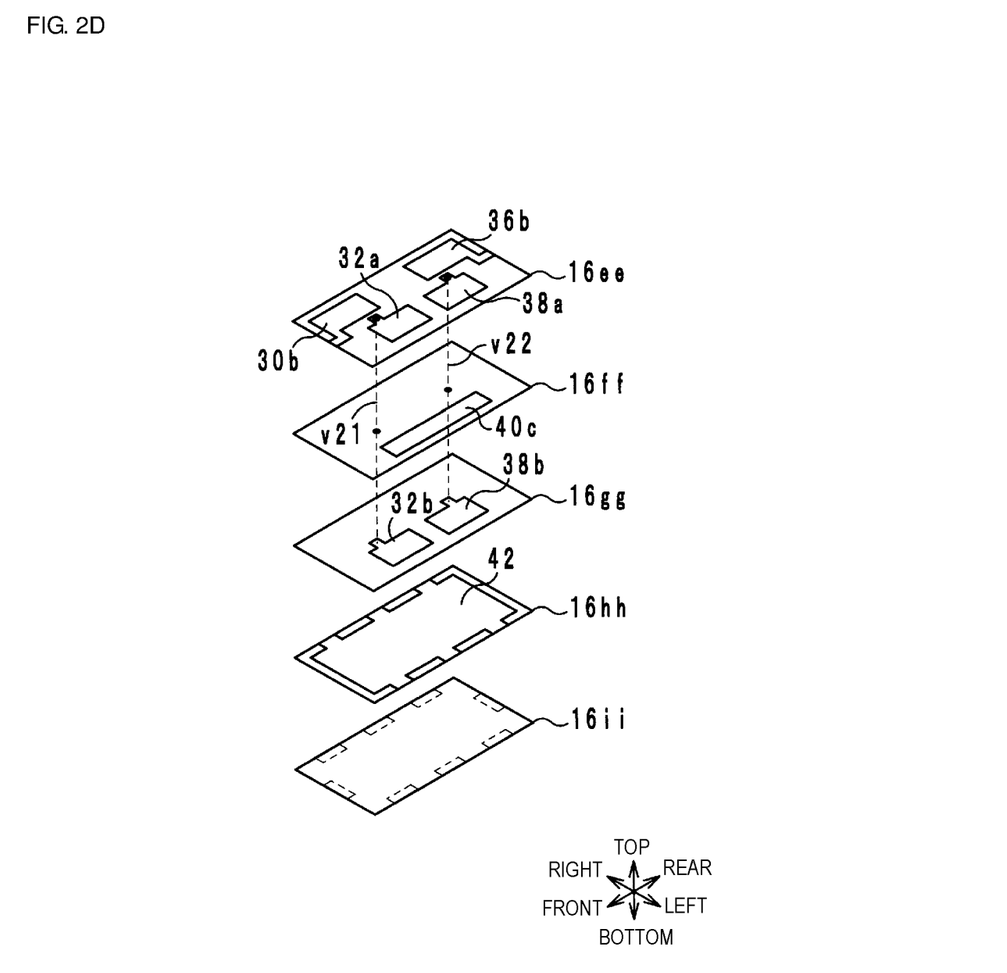
FIG. 2D is an exploded perspective view of the multilayer body 12 of the electronic component 10.

A configuration of a filter according to a preferred embodiment of the present invention will be described below with reference to the drawings. FIG. 1A is an equivalent circuit diagram of an electronic component 10 according to a preferred embodiment of the present invention. FIG. 1B is an external perspective view of the electronic component 10 shown in FIG. 1A. FIGS. 2A through 2D are exploded perspective views of a multilayer body 12 of the electronic component 10. Hereinafter, it is assumed that the top-bottom direction is a stacking direction of insulating layers 16. The direction along the long sides of the electronic component 10 as viewed from above is defined as a front-rear direction, and the direction along the short sides of the electronic component 10 as viewed from above is defined as a right-left direction. The top-bottom direction, the front-rear direction, and the right-left direction are perpendicular or substantially perpendicular to each other.

The equivalent circuit of the electronic component 10 includes, as shown in FIG. 1A, LC parallel resonators LC1 through LC3, capacitors C4 through C7, and outer terminals 14a through 14h. The LC parallel resonator LC1 includes an inductor L1 and a capacitor C1. The LC parallel resonator LC2 includes an inductor L2 and a capacitor C2. The LC parallel resonator LC3 includes an inductor L3 and a capacitor C3. The LC parallel resonators LC1 through LC3 are connected in series with each other in this order between the outer terminals 14a and 14b. The resonant frequency of the LC parallel resonator LC2 is lower than that of the LC parallel resonator LC1 and that of the LC parallel resonator LC3.

The capacitor C4 is disposed between a node between the outer terminal 14a and the LC parallel resonator LC1 and the outer terminals 14c through 14h. The capacitor C5 is disposed between a node between the LC parallel resonators LC1 and LC2 and the outer terminals 14c through 14h. The capacitor C6 is disposed between a node between the LC parallel resonators LC2 and LC3 and the outer terminals 14c through 14h. The capacitor C7 is disposed between a node between the LC parallel resonator LC3 and the outer terminal 14b and the outer terminals 14c through 14h.

The electronic component 10 having the structure described above preferably is used as a low pass filter. The outer terminals 14a and 14b are used as input/output terminals, and the outer terminals 14c through 14h are used as ground terminals.

The electronic component 10 includes, as shown in FIGS. 1B through 2D, the multilayer body 12, the outer terminals 14a through 14h, inductor conductors 18a through 18p, 22a through 22u, and 26a through 26p, connecting conductors 20a, 20b, 24a, and 24b, capacitor conductors 28a, 28b, 30a, 30b, 32a, 32b, 34a, 34b, 36a, 36b, 38a, 38b, and 40a through 40c, a ground conductor 42, and via-hole conductors v1 through v22.

As shown in FIGS. 1B through 2D, the multilayer body includes insulating layers 16a through 16z and 16a a through 16ii stacked on each other in the top-bottom direction, and preferably has rectangular or substantially rectangular parallelepiped shape. The multilayer body 12 includes therein the LC parallel resonators LC1 through LC3 and the capacitors C4 through C7.

As shown in FIGS. 2A through 2D, the insulating layers 16a through 16z and 16a a through 16ii are provided with a rectangular or substantially rectangular shape and include, for example, a ceramic dielectric sintered with the conductors together. The insulating layers 16a through 16z and 16aa through 16ii are stacked on each other such that they are arranged from the top side to the bottom side in this order. Hereinafter, the upper surfaces of the insulating layers 16a through 16z and 16aa through 16ii will be referred to as "the top surfaces", and the lower surfaces of the insulating layers 16a through 16z and 16aa through 16ii will be referred to as "the bottom surfaces". As the insulating layers 16a through 16z and 16a a through 16ii, resin layers may be used.

The inductor L1 is provided with a spiral shape such that it turns around a winding axis extending in parallel or substantially in parallel with the front-rear direction. The inductor L1 is disposed near the front surface of the multilayer body 12. The inductor L1 is defined by the inductor conductors 18a through 18p and the via-hole conductors v1 through v5. The inductor conductors 18a through 18c are linear conductive layers disposed on the top surfaces of the insulating layers 16b through 16d, respectively. The inductor conductors 18a through 18c extend, by a small distance, from the center of the short front sides of the insulating layers 16b through 16d, respectively, toward the rear sides, and then extend toward the right sides. The right ends of the inductor conductors 18a through 18c are located near the corners of the right front portions of the insulating layers 16b through 16d, respectively.

The inductor conductor 18d is a linear conductive layer disposed on the top surface of the insulating layer 16z. The inductor conductor 18d extends along the short front side of the insulating layer 16z. The right end of the inductor conductor 18d is superposed on the right ends of the inductor conductors 18a through 18c, as viewed from above.

The inductor conductors 18e through 18g are linear conductive layers disposed on the top surfaces of the insulating layers 16h through 16j, respectively. The inductor conductors 18e through 18g extend along the short front sides of the insulating layers 16h through 16j, respectively. The left ends of the inductor conductors 18e through 18g are superposed on the left end of the inductor conductor 18d, as viewed from above.

The inductor conductors 18h through 18j are linear conductive layers disposed on the top surfaces of the insulating layers 16w through 16y, respectively. The inductor conductors 18h through 18j extend along the short front sides of the insulating layers 16w through 16y, respectively. The right ends of the inductor conductors 18h through 18j are superposed on the right ends of the inductor conductors 18e through 18g, as viewed from above.

The inductor conductors 18k through 18m are linear conductive layers disposed on the top surfaces of the insulating layers 16k through 16m, respectively. The inductor conductors 18k through 18m extend along the short front sides of the insulating layers 16k through 16m, respectively. The left ends of the inductor conductors 18k through 18m are superposed on the left ends of the inductor conductors 18h through 18j, as viewed from above.

The inductor conductors 18n through 18p are linear conductive layers disposed on the top surfaces of the insulating layers 16t through 16v, respectively. The inductor conductors 18n through 18p extend, by a small distance, from the vicinities of the right ends the short front sides of the insulating layers 16t through 16v, respectively, toward the left sides, and then extend toward the rear sides. The right ends of the inductor conductors 18n through 18p are superposed on the right ends of the inductor conductors 18k through 18m, as viewed from above.

The via-hole conductor v1 is an interlayer connecting conductor which passes through the insulating layers 16b through 16y in the top-bottom direction. The via-hole conductor v1 is formed preferably, for example, by connecting a plurality of via-hole conductors which pass through the respective insulating layers 16b through 16y. The via-hole conductor v1 connects the right ends of the inductor conductors 18a through 18c and the right end of the inductor conductor 18d.

The via-hole conductor v2 is an interlayer connecting conductor which passes through the insulating layers 16h through 16y in the top-bottom direction. The via-hole conductor v2 is formed preferably, for example, by connecting a plurality of via-hole conductors which pass through the respective insulating layers 16h through 16y. The via-hole conductor v2 connects the left end of the inductor conductor 18d and the left ends of the inductor conductors 18e through 18g.

The via-hole conductor v3 is an interlayer connecting conductor which passes through the insulating layers 16h through 16x in the top-bottom direction. The via-hole conductor v3 is formed preferably, for example, by connecting a plurality of via-hole conductors which pass through the respective insulating layers 16h through 16x. The via-hole conductor v3 connects the right ends of the inductor conductors 18e through 18g and the right ends of the inductor conductors 18h through 18j.

The via-hole conductor v4 is an interlayer connecting conductor which passes through the insulating layers 16k through 16x in the top-bottom direction. The via-hole conductor v4 is formed preferably, for example, by connecting a plurality of via-hole conductors which pass through the respective insulating layers 16k through 16x. The via-hole conductor v4 connects the left ends of the inductor conductors 18h through 18j and the left ends of the inductor conductors 18k through 18m.

The via-hole conductor v5 is an interlayer connecting conductor which passes through the insulating layers 16k through 16u in the top-bottom direction. The via-hole conductor v5 is formed preferably, for example, by connecting a plurality of via-hole conductors which pass through the respective insulating layers 16k through 16u. The via-hole conductor v5 connects the right ends of the inductor conductors 18k through 18m and the right ends of the inductor conductors 18n through 18p.

Partial portions of the inductor conductors 18a through 18c, the inductor conductors 18d through 18m, and the inductor conductors 18n through 18p overlap each other, as viewed from above. Accordingly, the inductor L1 is provided with a spiral shape such that it turns counterclockwise from the outer periphery to the center in or substantially in the same plane, as viewed from the front side.

The inductor L3 is provided with a spiral shape such that it turns around a winding axis extending in parallel or substantially in parallel with the front-rear direction. The inductor L3 is disposed near the rear surface of the multilayer body 12. The structure of the inductor L3 is preferably the same as the structure in which the inductor L1 is rotated by 180° about a line extending in the top-bottom direction passing through the intersection point of diagonal lines of the insulating layers 16a through 16z and 16aa through 16ii as the central axis. The inductor L3 is defined by inductor conductors 26a through 26p and via-hole conductors v16 through v20.

The inductor conductors 26a through 26c are linear conductive layers disposed on the top surfaces of the insulating layers 16t through 16v, respectively. The inductor conductors 26a through 26c extend from positions on the rear side of the front-rear center of the insulating layers 16t through 16v, respectively, toward the rear sides, and then extend toward the left sides in the vicinities of the short rear sides of the insulating layers 16t through 16v, respectively. The left ends of the inductor conductors 26a through 26c are located near the corners of the rear left portions of the insulating layers 16t through 16v, respectively.

The inductor conductors 26d through 26f are linear conductive layers disposed on the top surfaces of the insulating layers 16k through 16m, respectively. The inductor conductors 26d through 26f extend along the short rear sides of the insulating layers 16k through 16m, respectively. The left ends of the inductor conductors 26d through 26f are superposed on the left ends of the inductor conductors 26a through 26c, as viewed from above.

The inductor conductors 26g through 26i are linear conductive layers disposed on the top surfaces of the insulating layers 16w through 16y, respectively. The inductor conductors 26g through 26i extend along the short rear sides of the insulating layers 16w through 16y, respectively. The right ends of the inductor conductors 26g through 26i are superposed on the right ends of the inductor conductors 26d through 26f, as viewed from above.

The inductor conductors 26j through 26l are linear conductive layers disposed on the top surfaces of the insulating layers 16h through 16j, respectively. The inductor conductors 26j through 26l extend along the short rear sides of the insulating layers 16h through 16j, respectively. The left ends of the inductor conductors 26j through 26l are superposed on the left ends of the inductor conductors 26g through 26i, as viewed from above.

The inductor conductor 26m is a linear conductive layer disposed on the top surface of the insulating layer 16z. The inductor conductor 26m extends along the short rear side of the insulating layer 16z. The right end of the inductor conductor 26m is superposed on the right ends of the inductor conductors 26j through 26l, as viewed from above.

The inductor conductors 26n through 26p are linear conductive layers disposed on the top surfaces of the insulating layers 16b through 16d, respectively. The inductor conductors 26n through 26p extend, by a small distance, from the vicinities of the left ends of the short rear sides of the insulating layers 16b through 16d, respectively, toward the right sides. The inductor conductors 26n through 26p then extend toward the rear sides and extend to the center of the short rear sides of the insulating layers 16b through 16d, respectively. The left ends of the inductor conductors 26n through 26p are superposed on the left end of the inductor conductor 26m, as viewed from above.

The via-hole conductor v16 is an interlayer connecting conductor which passes through the insulating layers 16k through 16u in the top-bottom direction. The via-hole conductor v16 is formed preferably, for example, by connecting a plurality of via-hole conductors which pass through the respective insulating layers 16k through 16u. The via-hole conductor v16 connects the left ends of the inductor conductors 26a through 26c and the left ends of the inductor conductors 26d through 26f.

The via-hole conductor v17 is an interlayer connecting conductor which passes through the insulating layers 16k through 16x in the top-bottom direction. The via-hole conductor v17 is formed preferably, for example, by connecting a plurality of via-hole conductors which pass through the respective insulating layers 16k through 16x. The via-hole conductor v17 connects the right ends of the inductor conductors 26d through 26f and the right ends of the inductor conductors 26g through 26i.

The via-hole conductor v18 is an interlayer connecting conductor which passes through the insulating layers 16h through 16x in the top-bottom direction. The via-hole conductor v18 is formed preferably, for example, by connecting a plurality of via-hole conductors which pass through the respective insulating layers 16h through 16x. The via-hole conductor v18 connects the left ends of the inductor conductors 26g through 26i and the left ends of the inductor conductors 26j through 26l.

The via-hole conductor v19 is an interlayer connecting conductor which passes through the insulating layers 16h through 16y in the top-bottom direction. The via-hole conductor v19 is formed preferably, for example, by connecting a plurality of via-hole conductors which pass through the respective insulating layers 16h through 16y. The via-hole conductor v19 connects the right ends of the inductor conductors 26j through 26l and the right end of the inductor conductor 26m.

The via-hole conductor v20 is an interlayer connecting conductor which passes through the insulating layers 16b through 16y in the top-bottom direction. The via-hole conductor v20 is formed preferably, for example, by connecting a plurality of via-hole conductors which pass through the respective insulating layers 16b through 16y. The via-hole conductor v20 connects the left end of the inductor conductor 26m and the left ends of the inductor conductors 26n through 26p.

Partial portions of the inductor conductors 26a through 26c, the inductor conductors 26d through 26m, and the inductor conductors 26n through 26p overlap each other, as viewed from above. Accordingly, the inductor L3 is provided with a spiral shape such that it turns counterclockwise from the center to the outer periphery in or substantially in the same plane, as viewed from the front side.

The inductor L2 is provided with a helical shape such that it turns around a winding axis extending in parallel with the front-rear direction. The inductor L2 is disposed near the center of the multilayer body 12 in the front-rear direction. That is, the inductor L2 is disposed between the inductors L1 and L3. With this arrangement, the inductors L1, L2, and L3 are disposed from the front side to the rear side in this order. The big difference between the structure of the inductors L1 and L3 provided with a spiral shape and that of the inductor L2 provided with a helical shape is that the inductor L2 is provided in the multilayer body 12 with a predetermined length in the front-rear direction.

The inductor L2 is defined by the inductor conductors 22a through 22u and the via-hole conductors v8 through v13. The inductor conductors 22a through 22c are linear conductive layers disposed on the top surfaces of the insulating layers 16t through 16v, respectively. The inductor conductors 22a through 22c extend, by a small distance, from positions on the front side of the front-rear center of the insulating layers 16t through 16v, respectively, toward the rear sides, and then extend toward the rear right side. The right ends of the inductor conductors 22a through 22c are located near the long right sides of the insulating layers 16t through 16v, respectively.

The inductor conductors 22d through 22f are linear conductive layers disposed on the top surfaces of the insulating layers 16b through 16d, respectively. The inductor conductors 22d through 22f extend in the right-left direction at positions slightly on the front sides of the front-rear center of the insulating layers 16b through 16d, respectively. The right ends of the inductor conductors 22d through 22f are superposed on the right ends of the inductor conductors 22a through 22c, as viewed from above.

The inductor conductors 22g through 22i are linear conductive layers disposed on the top surfaces of the insulating layers 16q through 16s, respectively. The inductor conductors 22g through 22i extend in the right-left direction at positions slightly on the front sides of the front-rear center of the insulating layers 16q through 16s, respectively. The inductor conductors 22g through 22i slightly tilt with respect to the right-left direction such that they extend toward the rear right side. The left ends of the inductor conductors 22g through 22i are superposed on the left ends of the inductor conductors 22d through 22f, as viewed from above.

The inductor conductors 22j through 22l are linear conductive layers disposed on the top surfaces of the insulating layers 16e through 16g, respectively. The inductor conductors 22j through 22l extend in the right-left direction at the front-rear center of the insulating layers 16e through 16g, respectively. The right ends of the inductor conductors 22j through 22l are superposed on the right ends of the inductor conductors 22g through 22i, as viewed from above.

The inductor conductors 22m through 22o are linear conductive layers disposed on the top surfaces of the insulating layers 16n through 16p, respectively. The inductor conductors 22m through 22o extend in the right-left direction at positions slightly on the rear sides of the front-rear center of the insulating layers 16n through 16p, respectively. The inductor conductors 22m through 22o slightly tilt with respect to the right-left direction such that they extend toward the rear right side. The left ends of the inductor conductors 22m through 22o are superposed on the left ends of the inductor conductors 22j through 22l, as viewed from above.

The inductor conductors 22p through 22r are linear conductive layers disposed on the top surfaces of the insulating layers 16b through 16d, respectively. The inductor conductors 22p through 22r extend in the right-left direction at positions slightly on the rear sides of the front-rear center of the insulating layers 16b through 16d, respectively. The right ends of the inductor conductors 22p through 22r are superposed on the right ends of the inductor conductors 22m through 22o, as viewed from above.

The inductor conductors 22s through 22u are linear conductive layers disposed on the top surfaces of the insulating layers 16t through 16v, respectively. The inductor conductors 22s through 22u extend from the vicinities of the long left sides of the insulating layers 16t through 16v, respectively, toward the rear right side, at positions slightly on the rear sides of the front-rear center of the insulating layers 16t through 16v, respectively, and then extend toward the rear sides by a small distance. The left ends of the inductor conductors 22s through 22u are superposed on the left ends of the inductor conductors 22p through 22r, as viewed from above.

As described above, the inductor conductors 22d through 22f, the inductor conductors 22j through 22l, and the inductor conductors 22p through 22r are arranged from the front side to the rear side and are also parallel or substantially parallel with each other. The inductor conductors 22g through 22i and the inductor conductors 22m through 22o are arranged from the front side to the rear side and are also parallel or substantially parallel with each other. The inductor conductors 22g through 22i and the inductor conductors 22m through 22o are disposed on the insulating layers at levels lower than the inductor conductors 22d through 22f, the inductor conductors 22j through 22l, and the inductor conductors 22p through 22r.

The via-hole conductor v8 is an interlayer connecting conductor which passes through the insulating layers 16b through 16u in the top-bottom direction. The via-hole conductor v8 is formed preferably, for example, by connecting a plurality of via-hole conductors which pass through the respective insulating layers 16b through 16u. The via-hole conductor v8 connects the right ends of the inductor conductors 22a through 22c and the right ends of the inductor conductors 22d through 22f.

The via-hole conductor v9 is an interlayer connecting conductor which passes through the insulating layers 16b through 16r in the top-bottom direction. The via-hole conductor v9 is formed preferably, for example, by connecting a plurality of via-hole conductors which pass through the respective insulating layers 16b through 16r. The via-hole conductor v9 connects the left ends of the inductor conductors 22d through 22f and the left ends of the inductor conductors 22g through 22i.

The via-hole conductor v10 is an interlayer connecting conductor which passes through the insulating layers 16e through 16r in the top-bottom direction. The via-hole conductor v10 is formed preferably, for example, by connecting a plurality of via-hole conductors which pass through the respective insulating layers 16e through 16r. The via-hole conductor v10 connects the right ends of the inductor conductors 22g through 22i and the right ends of the inductor conductors 22j through 22l.

The via-hole conductor v11 is an interlayer connecting conductor which passes through the insulating layers 16e through 16o in the top-bottom direction. The via-hole conductor v11 is formed preferably, for example, by connecting a plurality of via-hole conductors which pass through the respective insulating layers 16e through 16o. The via-hole conductor v11 connects the left ends of the inductor conductors 22j through 22l and the left ends of the inductor conductors 22m through 22o.

The via-hole conductor v12 is an interlayer connecting conductor which passes through the insulating layers 16b through 16o in the top-bottom direction. The via-hole conductor v12 is formed preferably, for example, by connecting a plurality of via-hole conductors which pass through the respective insulating layers 16b through 16o. The via-hole conductor v12 connects the right ends of the inductor conductors 22*m* through 22*o* and the right ends of the inductor conductors 22*p* through 22*r*.

The via-hole conductor v13 is an interlayer connecting conductor which passes through the insulating layers 16*b* through 16*u* in the top-bottom direction. The via-hole conductor v13 is formed preferably, for example, by connecting a plurality of via-hole conductors which pass through the respective insulating layers 16*b* through 16*u*. The via-hole conductor v13 connects the left ends of the inductor conductors 22*p* through 22*r* and the left ends of the inductor conductors 22*s* through 22*u*.

The inductor L2 with the unique structure described above is provided with a helical shape such that it advances from the front side to the rear side while turning around clockwise, as viewed from the front side.

The inductors L1 through L3 with the unique structure described above are superposed on each other, as viewed from the front side. Accordingly, the inductors L1 through L3 are electromagnetically coupled with each other.

The capacitor C1 is defined by the capacitor conductors 30*a*, 30*b*, 28*a*, and 28*b*. This will be explained more specifically. The capacitor conductors 30*a* and 30*b* are rectangular or substantially rectangular conductive layers which are disposed on the top surfaces of the insulating layers 16*cc* and 16*ee*, respectively, and which are disposed in regions defined by the right half portions and the front half portions of the insulating layers 16*cc* and 16*ee*, respectively. The capacitor conductors 30*a* and 30*b* extend to the center of the short front sides of the insulating layers 16*cc* and 16*ee*, respectively. The capacitor conductors 28*a* and 28*b* are rectangular or substantially rectangular conductive layers which are disposed on the top surfaces of the insulating layers 16*aa* and 16*dd*, respectively, and which are disposed in regions defined by the right half portions and the front half portions of the insulating layers 16*aa* and 16*dd*, respectively. The capacitor conductors 28*a* and 28*b* are superposed on the capacitor conductors 30*a* and 30*b*, as viewed from above. With this arrangement, the capacitor conductor 28*a* opposes the capacitor conductor 30*a* with the insulating layers 16*aa* and 16*bb* interposed therebetween, while the capacitor conductor 28*b* opposes the capacitor conductor 30*a* with the insulating layer 16*cc* interposed therebetween and opposes the capacitor conductor 30*b* with the insulating layer 16*dd* interposed therebetween.

The capacitor C2 is defined by the capacitor conductors 32*a*, 32*b*, 38*a*, 38*b*, and 40*a* through 40*c*. This will be explained more specifically. The capacitor conductors 32*a* and 32*b* are rectangular or substantially rectangular conductive layers which are disposed on the top surfaces of the insulating layers 16*ee* and 16*gg*, respectively, and which are disposed in regions defined by the left half portions and the front half portions of the insulating layers 16*ee* and 16*gg*, respectively. The capacitor conductors 38*a* and 38*b* are rectangular or substantially rectangular conductive layers which are disposed on the top surfaces of the insulating layers 16*ee* and 16*gg*, respectively, and which are disposed in regions defined by the left half portions and the rear half portions of the insulating layers 16*ee* and 16*gg*, respectively. The capacitor conductors 40*a*, 40*b*, and 40*c* are strip-shaped conductive layers which are disposed on the top surfaces of the insulating layers 16*aa*, 16*dd*, and 16*ff*, respectively, and which extend in the front-rear direction in regions defined by the left half portions of the insulating layers 16*aa*, 16*dd*, and 16*ff*, respectively. The capacitor conductors 40*a* through 40*c* are superposed on the capacitor conductors 32*a*, 32*b*, 38*a*, and 38*b*, as viewed from above. With this arrangement, the capacitor conductors 32*a* and 38*a* oppose the capacitor conductor 40*b* with the insulating layer 16*dd* interposed therebetween and oppose the conductor 40*c* with the insulating layer 16*ee* interposed therebetween, while the capacitor conductors 32*b* and 38*b* oppose the capacitor conductor 40*c* with the insulating layer 16*ff* interposed therebetween.

The capacitor C3 is defined by the capacitor conductors 36*a*, 36*b*, 34*a*, and 34*b*. This will be explained more specifically. The capacitor conductors 36*a* and 36*b* are rectangular or substantially rectangular conductive layers which are disposed on the top surfaces of the insulating layers 16*cc* and 16*ee*, respectively, and which are disposed in regions defined by the right half portions and the rear half portions of the insulating layers 16*cc* and 16*ee*, respectively. The capacitor conductors 36*a* and 36*b* extend to the center of the short rear sides of the insulating layers 16*cc* and 16*ee*, respectively. The capacitor conductors 34*a* and 34*b* are rectangular or substantially rectangular conductive layers which are disposed on the top surfaces of the insulating layers 16*aa* and 16*dd*, respectively, and which are disposed in regions defined by right half portions and rear half portions of the insulating layers 16*aa* and 16*dd*, respectively. The capacitor conductors 34*a* and 34*b* are superposed on the capacitor conductors 36*a* and 36*b*, as viewed from above. With this arrangement, the capacitor conductor 34*a* opposes the capacitor conductor 36*a* with the insulating layers 16*aa* and 16*bb* interposed therebetween, while the capacitor conductor 34*b* opposes the capacitor conductor 36*a* with the insulating layer 16*cc* interposed therebetween and opposes the capacitor conductor 36*b* with the insulating layer 16*dd* interposed therebetween.

The capacitor C4 is defined by the capacitor conductor 30*b* and the ground conductor 42. This will be explained more specifically. The ground conductor 42 is a rectangular or substantially rectangular conductive layer which covers substantially the entire surface of the insulating layer 16*hh*, and overlaps the capacitor conductor 30*b*, as viewed from above. With this arrangement, the capacitor conductor 30*b* opposes the ground conductor 42 with the insulating layers 16*ee* through 16*gg* interposed therebetween. The ground conductor 42 extends to the long left side of the insulating layer 16*hh* at three portions and to the long right side of the insulating layer 16*hh* at three portions.

The capacitor C5 is defined by the capacitor conductor 32*b* and the ground conductor 42. This will be explained more specifically. The ground conductor 42 overlaps the capacitor conductor 32*b*, as viewed from above. With this arrangement, the capacitor conductor 32*b* opposes the ground conductor 42 with the insulating layer 16*gg* interposed therebetween.

The capacitor C6 is defined by the capacitor conductor 38*b* and the ground conductor 42. This will be explained more specifically. The ground conductor 42 overlaps the capacitor conductor 38*b*, as viewed from above. With this arrangement, the capacitor conductor 38*b* opposes the ground conductor 42 with the insulating layer 16*gg* interposed therebetween.

The capacitor C7 is defined by the capacitor conductor 36*b* and the ground conductor 42. This will be explained more specifically. The ground conductor 42 overlaps the capacitor conductor 36*b*, as viewed from above. With this arrangement, the capacitor conductor 36*b* opposes the ground conductor 42 with the insulating layers 16*ee*, 16*ff* and 16*gg* interposed therebetween.

The via-hole conductors v6, v7, and v21 and the connecting conductors 20*a* and 20*b* define a connecting portion that connects a portion between the LC parallel resonators LC1 and LC2 and the capacitor C5. This will be explained more specifically. The connecting conductors 20a and 20b are linear conductive layers which are disposed on the top surfaces of the insulating layers 16z and 16bb, respectively, and which extend in the front-rear direction in regions defined by the front half portions of the insulating layers 16z and 16bb, respectively. The front ends of the connecting conductors 20a and 20b are superposed on the rear ends of the inductor conductors 18n through 18p, as viewed from above. The rear ends of the connecting conductors 20a and 20b are superposed on the left ends of the inductor conductors 22a through 22c, as viewed from above.

The via-hole conductor v6 is an interlayer connecting conductor which passes through the insulating layers 16t through 16aa in the top-bottom direction. The via-hole conductor v6 is formed preferably, for example, by connecting a plurality of via-hole conductors which pass through the respective insulating layers 16t through 16aa. The via-hole conductor v6 connects the rear ends of the inductor conductors 18n through 18p and the front ends of the connecting conductors 20a and 20b.

The via-hole conductor v7 is an interlayer connecting conductor which passes through the insulating layers 16t through 16aa in the top-bottom direction. The via-hole conductor v7 is formed preferably, for example, by connecting a plurality of via-hole conductors which pass through the respective insulating layers 16t through 16aa. The via-hole conductor v7 connects the left ends of the inductor conductors 22a through 22c and the rear ends of the connecting conductors 20a and 20b. Accordingly, the via-hole conductors v6 and v7 and the connecting conductors 20a and 20b connect the inductors L1 and L2.

The via-hole conductor v21 is an interlayer connecting conductor which passes through the insulating layers 16z through 16ff in the top-bottom direction. The via-hole conductor v21 is formed preferably, for example, by connecting a plurality of via-hole conductors which pass through the respective insulating layers 16z through 16ff. The via-hole conductor v21 connects the front-rear center of each of the connecting conductors 20a and 20b and the capacitor conductors 28a, 28b, 32a, and 32b. Accordingly, the via-hole conductor v21 connects the connecting conductors 20a and 20b and the capacitors C1, C2, and C5.

The via-hole conductors v14, v15, and v22 and the connecting conductors 24a and 24b define a connecting portion that connects a portion between the LC parallel resonators LC2 and LC3 and the capacitor C6. This will be explained more specifically. The connecting conductors 24a and 24b are linear conductive layers which are disposed on the top surfaces of the insulating layers 16z and 16bb, respectively, and which extend in the front-rear direction in regions defined by the rear half portions of the insulating layers 16z and 16bb, respectively. The front ends of the connecting conductors 24a and 24b are superposed on the right ends of the inductor conductors 22s through 22u, as viewed from above. The rear ends of the connecting conductors 24a and 24b are superposed on the front ends of the inductor conductors 26a through 26c, as viewed from above.

The via-hole conductor v14 is an interlayer connecting conductor which passes through the insulating layers 16t through 16aa in the top-bottom direction. The via-hole conductor v14 is formed preferably, for example, by connecting a plurality of via-hole conductors which pass through the respective insulating layers 16t through 16aa. The via-hole conductor v14 connects the right ends of the inductor conductors 22s through 22u and the front ends of the connecting conductors 24a and 24b.

The via-hole conductor v15 is an interlayer connecting conductor which passes through the insulating layers 16t through 16aa in the top-bottom direction. The via-hole conductor v15 is formed preferably, for example, by connecting a plurality of via-hole conductors which pass through the respective insulating layers 16t through 16aa. The via-hole conductor v15 connects the front ends of the inductor conductors 26a through 26c and the rear ends of the connecting conductors 24a and 24b. Accordingly, the via-hole conductors v14 and v15 and the connecting conductors 24a and 24b connect the inductors L2 and L3.

The via-hole conductor v22 is an interlayer connecting conductor which passes through the insulating layers 16z through 16ff in the top-bottom direction. The via-hole conductor v22 is formed preferably, for example, by connecting a plurality of via-hole conductors which pass through the respective insulating layers 16z through 16ff. The via-hole conductor v22 connects the front-rear center of each of the connecting conductors 24a and 24b and the capacitor conductors 34a, 34b, 38a, and 38b. Accordingly, the via-hole conductor v22 connects the connecting conductors 24a and 24b and the capacitors C2, C3, and C6.

The outer terminal 14a is disposed, as shown in FIG. 1B, such that it extends in the top-bottom direction on the front surface of the multilayer body 12. With this arrangement, the outer terminal 14a is connected to the inductor conductors 18a through 18c and the capacitor conductors 30a and 30b. That is, the outer terminal 14a is connected to the inductor L1 and the capacitors C1 and C4.

The outer terminal 14b is disposed, as shown in FIG. 1B, such that it extends in the top-bottom direction on the rear surface of the multilayer body 12. With this arrangement, the outer terminal 14b is connected to the inductor conductors 26n through 26p and the capacitor conductors 36a and 36b. That is, the outer terminal 14b is connected to the inductor L3 and the capacitors C3 and C7.

The outer terminals 14c, 14d, and 14e are disposed, as shown in FIG. 1B, such that they are arranged from the front side to the rear side in this order on the left surface of the multilayer body 12. The outer terminals 14c through 14e extend in the top-bottom direction. With this arrangement, the outer terminals 14c through 14e are connected to the ground conductor 42. That is, the outer terminals 14c through 14e are connected to the capacitors C4 through C7.

The outer terminals 14f, 14g, and 14h are disposed, as shown in FIG. 1B, such that they are arranged from the front side to the rear side in this order on the right surface of the multilayer body 12. The outer terminals 14f through 14h extend in the top-bottom direction. With this arrangement, the outer terminals 14f through 14h are connected to the ground conductor 42. That is, the outer terminals 14f through 14h are connected to the capacitors C4 through C7.

A non-limiting example of a manufacturing method for the electronic component 10 will now be discussed below with reference to FIGS. 1 and 2.

First, ceramic green sheets, which will be used as the insulating layers 16a through 16z and 16aa through 16ii, are prepared. Then, the via-hole conductors v1 through v22 are formed in the ceramic green sheets which will be used as the insulating layers 16b through 16z and 16aa through 16ff. More specifically, by applying a laser beam to the ceramic green sheets which will be used as the insulating layers 16b through 16z and 16a through 16ff, via-holes are formed. Then, a conductive paste made of Ag, Pd, Cu, Au, or an alloy thereof is filled into the via-holes by print coating.

Then, a conductive paste made of Ag, Pd, Cu, Au, or an alloy thereof as a principal component is applied to the top surfaces of the ceramic green sheets which will be used as the insulating layers 16b through 16z and 16aa through 16hh by using a screen printing or photolithographic process, thus forming the inductor conductors 18a through 18p, 22a through 22u, and 26a through 26p, the connecting conductors 20a, 20b, 24a, and 24b, the capacitor conductors 28a, 28b, 30a, 30b, 32a, 32b, 34a, 34b, 36a, 36b, 38a, 38b, and 40a through 40c, and the ground conductor 42. A conductive paste may be filled into the via-holes when forming the inductor conductors 18a through 18p, 22a through 22u, and 26a through 26p, the connecting conductors 20a, 20b, 24a, and 24b, the capacitor conductors 28a, 28b, 30a, 30b, 32a, 32b, 34a, 34b, 36a, 36b, 38a, 38b, and 40a through 40c, and the ground conductor 42.

Then, the ceramic green sheets are stacked on each other. More specifically, the ceramic green sheets, which will be used as the insulating layers 16a through 16z and 16aa through 16ii, are stacked and pressure-bonded to each other one by one. According to the above-described process, a mother multilayer body is formed. Then, this mother multilayer body is subjected to final pressure-bonding by, for example, isostatic pressing.

Then, the mother multilayer body is cut into multilayer bodies 12 having a predetermined size by using a cutting blade.

According to the above-described process, unfired multilayer bodies 12 are obtained. Then, barrel finishing is performed on each unfired multilayer body 12, thus chamfering the unfired multilayer body 12. Then, debinding and firing is performed on the unfired multilayer body 12.

Finally, by applying a conductive paste made of Ag, Pd, Cu, Au, or an alloy thereof as a principal component to the top surface of the multilayer body 12, underlayer electrodes, which will form the outer terminals 14a through 14h, are formed. Then, Ni-plating/Sn-plating is performed on the top surfaces of the underlayer electrodes so as to form the outer terminals 14a through 14h. According to the above-described process, the electronic component 10 is formed. Firing of the multilayer body may be performed after forming the outer terminals 14a through 14h. More specifically, the mother multilayer body is cut into the multilayer bodies 12, barrel finishing is performed on each multilayer body 12, the outer terminals are formed by applying a conductive paste, and then, the multilayer body 12 is fired.

By using the electronic component 10 with the unique structure described above, it is possible to reduce the insertion loss. This will be explained more specifically. In the electronic component 10, the inductor L2 preferably is a helical inductor. Since the air-core diameter of a helical inductor is larger than that of a spiral inductor, it is possible to increase the Q factor of the inductor L2. Additionally, the inductance value of the helical inductor L2 is greater than that of a spiral inductor. Thus, it is possible to reduce the insertion loss of the electronic component 10.

In the electronic component 10, it is possible to obtain a sufficient attenuation in a band other than the pass band. This will be explained more specifically. In the electronic component 10, the inductors L1 through L3 are disposed from the front side to the rear side in this order. Additionally, the inductors L1 and L3 are provided with a spiral shape such that they turn around the winding axes extending in the front-rear direction. The front-rear length of the inductors L1 and L3 provided with a spiral shape is shorter than that of an inductor provided with a helical shape. Accordingly, in a case in which the inductors L1 and L3 are provided with a spiral shape, the distance between the inductors L1 and L2 and the distance between the inductors L2 and L3 become greater than those in a case in which the inductors L1 and L3 are provided with a helical shape. Thus, electromagnetic coupling between the inductors L1 and L2 and between the inductors L2 and L3 becomes weaker. With this structure, it is more difficult for a high frequency signal to be transmitted between the inductors L1 and L2 and between the inductors L2 and L3. As a result, it is possible to obtain a sufficient attenuation in a band other than the pass band.

Figure 3:
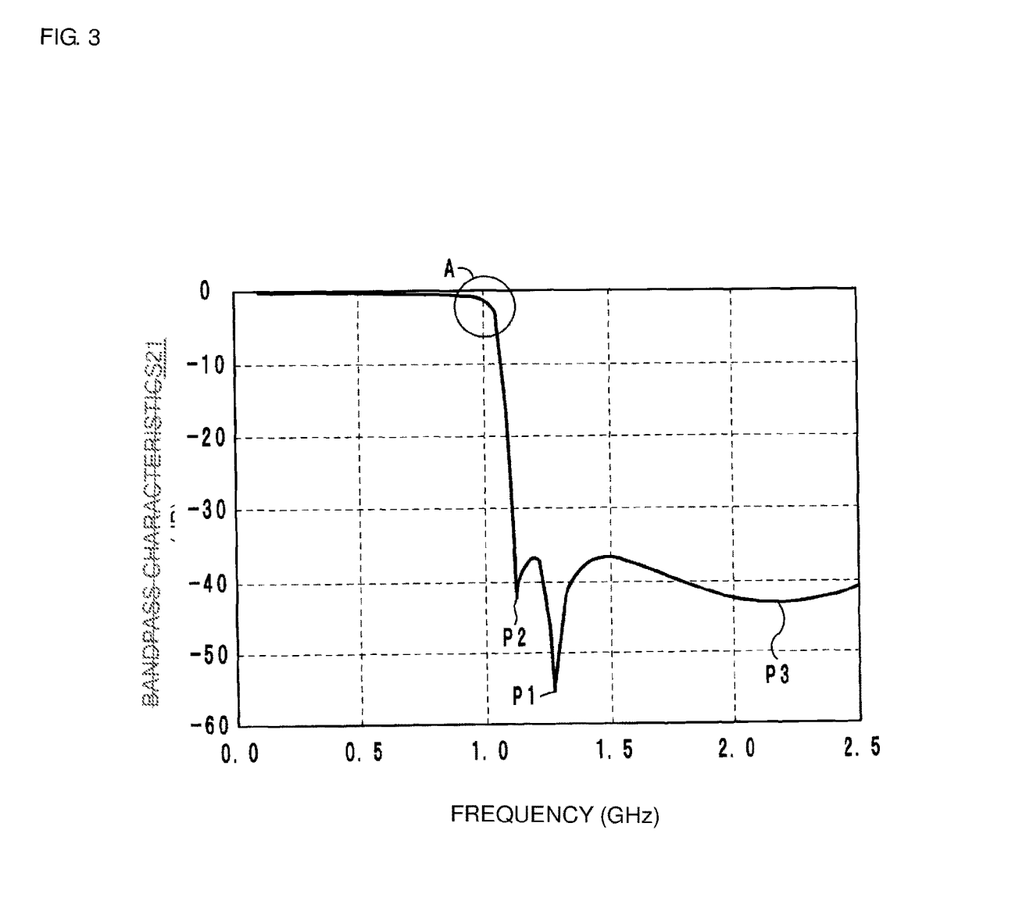
FIG. 3 is a graph illustrating a S21 of the electronic component 10.

In the electronic component 10, it is preferable that the resonant frequency of the LC parallel resonator LC2 be lower than that of each of the LC parallel resonators LC1 and LC3. With this arrangement, when the electronic component 10 is used as a low pass filter, the S21 of the electronic component 10 sharply falls from the highest frequency of the pass band. FIG. 3 is a graph illustrating the S21 of the electronic component 10. The vertical axis indicates the S21, while the horizontal axis indicates the frequency.

This will be explained more specifically. If the resonant frequency of the LC parallel resonator LC2 is lower than that of each of the LC parallel resonators LC1 and LC3, an attenuation pole P2 is provided by the LC parallel resonator LC2, an attenuation pole P1 is provided by the LC parallel resonator LC1, and an attenuation pole P3 is provided by the LC parallel resonator LC3. The frequency of the attenuation pole P2 is lower than that of each of the attenuation poles P1 and P3, and is positioned near the highest frequency of the pass band. In the electronic component 10 with the unique structure described above, if the inductor L2 of the LC parallel resonator LC2, which provides the attenuation pole P2, is a helical inductor having a high Q factor, the insertion loss near the attenuation pole P2 is reduced. As a result, the S21 sharply falls from the highest frequency of the pass band, as indicated by portion A in FIG. 3.

In the electronic component 10, a reduction in the resistance of the inductors L1 through L3 is implemented. This will be explained by taking the inductor L1 as an example. In the inductor L1, the inductor conductors 18a through 18c are connected in parallel with each other, the inductor conductors 18e through 18g are connected in parallel with each other, the inductor conductors 18k through 18m are connected in parallel with each other, and the inductor conductors 18n through 18p are connected in parallel with each other. With this arrangement, a reduction in the resistance of the inductor L1 is implemented. For the same reason, a reduction in the resistance of each of the inductors L2 and L3 is also implemented.

In the electronic component 10, the inductor conductors 22d through 22f and the inductor conductors 22p through 22r are disposed on the insulating layers 16b through 16d, respectively, and the inductor conductors 22j through 22l are disposed on the insulating layers 16e through 16g, respectively. That is, in the inductor L2, the inductor conductors 22d through 22f, 22j through 22l, and 22p through 22r, which are disposed at relatively higher levels, are distributed among different layers. In this manner, by changing the positions of the inductor conductors 22d through 22f, 22j through 22l, and 22p through 22r in the top-bottom direction, the air-core diameter of the inductor L2 is able to be adjusted, thus making it possible to adjust the inductance value of the inductor L2. For the same reason, the inductor conductors 22g through 22i are disposed on the insulating layers 16q through 16s, respectively, and the inductor conductors 22m through 22o are disposed on the insulating layers 16n through 16p, respectively.

In the electronic component 10, when a current flows through the inductors L1 through L3, the direction in which the current flows through the inductors L1 and L3 is opposite to that of the inductor L2. It is thus possible to decrease electromagnetic coupling between the inductors L1 and L2 and between the inductors L2 and L3.

In the electronic component 10, the capacitors C4 through C7 are disposed. Among high frequency signals which pass through the LC parallel resonators LC1 through LC3, high frequency signals having a frequency higher than the pass band flow to a ground via the capacitors C4 through C7. This makes it possible to further enhance the function of the electronic component 10 as a low pass filter.

Other Preferred Embodiments

Electronic components according to the present invention are not restricted to the electronic component 10, and may be modified within the scope of the present invention.

The number of LC parallel resonators is not restricted to three, and may be four or more. If n LC parallel resonators LC1 through LCn are disposed, inductors L1 and Ln of the LC parallel resonators LC1 and LCn, which are respectively positioned at both ends in the front-rear direction, are provided with a spiral shape. At least one of the inductors of the LC parallel resonators LC2 through LCn−1 is provided with a helical shape. In this case, it is preferable that the resonant frequencies of the LC parallel resonators LC1 and LCn respectively disposed near the outer terminals 14$a$ and 14$b$ be higher than those of the LC parallel resonators LC2 through LCn−1.

Additionally, the coil diameter of at least one of the inductors of the LC parallel resonators LC2 through LCn−1 may not have to be the same throughout the entire length of the inductor. By changing the coil diameter, the inductance value may be adjusted so that a suitable inductance value can be obtained.

The winding axes of the inductors L1 through L3 extend in parallel or substantially in parallel with the front-rear direction. However, the winding axes of the inductors L1 through L3 may be slightly displaced from the front-rear direction. That is, it is sufficient if the winding axes of the inductors L1 through L3 extend along the front-rear direction.

When a current flows through the inductors L1, L2, and L3, the direction in which the current flows through the inductor L1 may be opposite to that of the inductor L3. This makes it possible to decrease the electromagnetic coupling between the inductors L1 and L3.

When a current flows through the inductors L1 through L3, the direction in which the current flows through the inductors L1 and L3 may be the same as that of the inductor L2. This makes it possible to adjust the electromagnetic coupling between the inductors L1 and L2 and between the inductors L2 and L3.

Preferred embodiments of the present invention may be suitably used as an electronic component, and in particular, are excellent in terms of obtaining a sufficient attenuation in a band other than a pass band while reducing insertion loss.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An electronic component comprising:
    a device body; and
    first through n-th LC parallel resonators connected in series with each other where n is an integer of three or more; wherein
    the first through n-th LC parallel resonators respectively include first through n-th inductors and first through n-th capacitors;
    the first through n-th inductors are disposed in the device body such that the first through n-th inductors are arranged in a first direction in order from the first inductor to the n-th inductor;
    the first through n-th inductors are directly connected in series with each other;
    the first and n-th inductors are provided with a spiral shape such that the first and n-th inductors turn around respective winding axes extending along the first direction; and
    at least one of the second through (n−1)-th inductors is provided with a helical shape such that the at least one of the second through (n−1)-th inductors turns around a winding axis extending along the first direction.

2. The electronic component according to claim 1, wherein n is three.

3. The electronic component according to claim 2, wherein a resonant frequency of the second LC parallel resonator is lower than a resonant frequency of the first LC parallel resonator and a resonant frequency of the third LC parallel resonator.

4. The electronic component according to claim 2, further comprising:
    an input terminal that is disposed on a first surface of the device body and that is connected to the first LC parallel resonator;
    an output terminal that is disposed on a second surface of the device body and that is connected to the third LC parallel resonator;
    a ground terminal disposed on a third surface of the device body; and
    a capacitor disposed between a node between the input terminal and the first LC parallel resonator and the ground terminal, between a node between the first and second LC parallel resonators and the ground terminal, between a node between the second and third LC parallel resonators and the ground terminal, or between a node between the third LC parallel resonator and the output terminal and the ground terminal.

5. The electronic component according to claim 4, wherein
    the device body includes a plurality of insulating layers stacked on each other in a second direction which is perpendicular or substantially perpendicular to the first direction; and
    the first through third LC parallel resonators include inner conductors disposed on the corresponding plurality of insulating layers and interlayer connecting conductors which pass through the corresponding plurality of insulating layers in the second direction.

6. The electronic component according to claim 5, wherein the first through third inductors each include a plurality of inductor conductors of the inner conductors connected in parallel with each other.

7. The electronic component according to claim 5, wherein
    the second inductor includes:
        a plurality of first interlayer connecting conductors of the interlayer connecting conductors that each connect one end portion of a corresponding first inductor conductor of the inner conductors and one end portion of a corresponding second inductor conductor of the inner conductors; and a plurality of second interlayer connecting conductors of the interlayer connecting conductors that each connect another end portion of the corresponding first inductor conductor and another end portion of the corresponding second inductor conductor; and the first and second inductor conductors of the second inductor are distributed among the plurality of the insulating layers.

8. The electronic component according to claim 2, wherein, when a current flows through the first through third inductors, a direction in which the current flows through the first and third inductors is opposite to a direction in which the current flows through the second inductor.

9. The electronic component according to claim 1, wherein n is four or more.

10. The electronic component according to claim 1, wherein resonant frequencies of the second through (n−1)-th LC parallel resonators are lower than a resonant frequency of the first LC parallel resonator and a resonant frequency of the n-th LC parallel resonator.

11. The electronic component according to claim 1, wherein the electronic component is a low pass filter.

12. The electronic component according to claim 1, wherein two of the first through n-th inductors are positioned at opposite ends in a front-rear direction of the electronic component and are provided with a spiral shape.

13. The electronic component according to claim 1, further comprising outer terminals, wherein resonant frequencies of two of the first through n-th LC parallel resonators located closest to the outer terminals are higher than resonant frequencies of remaining ones of the first through n-th LC parallel resonators.

14. The electronic component according to claim 1, wherein a coil diameter of at least one of the second through (n−1)-th LC parallel resonators changes along a length thereof.

15. The electronic component according to claim 1, wherein the respective winding axes of at least three of the first through n-th inductors extend parallel or substantially parallel to a front-rear direction of the electronic component.

16. The electronic component according to claim 1, wherein the respective winding axes of at least three of the first through n-th inductors extend along a front-rear direction of the electronic component.

17. The electronic component according to claim 1, wherein a current flows through at least one of the first through n-th inductors in a direction that is different from a current that flows through at least another of the first through n-th inductors.

18. The electronic component according to claim 1, wherein a current flows through at least three of the first through n-th inductors in a same direction.

* * * * *